United States Patent
Bruekers et al.

(10) Patent No.: US 7,577,696 B2
(45) Date of Patent: Aug. 18, 2009

(54) MULTIRATE FILTER AS WELL AS DISPLAY SYSTEM AND MOBILE TELEPHONE COMPRISING SAID MULTIRATE FILTER

(75) Inventors: Alphons Antonius Maria Lambertus Bruekers, Eindhoven (NL); Antonius Adrianus Cornelis Maria Kalker, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 812 days.

(21) Appl. No.: 10/537,066

(22) PCT Filed: Dec. 4, 2003

(86) PCT No.: PCT/IB03/05647

§ 371 (c)(1),
(2), (4) Date: Jun. 1, 2005

(87) PCT Pub. No.: WO2004/054103

PCT Pub. Date: Jun. 24, 2004

(65) Prior Publication Data

US 2006/0056553 A1 Mar. 16, 2006

(30) Foreign Application Priority Data

Dec. 6, 2002 (EP) .................................. 02080103

(51) Int. Cl.
*G06F 17/10* (2006.01)
(52) U.S. Cl. ...................................................... 708/313
(58) Field of Classification Search .................. 708/313
See application file for complete search history.

(56) References Cited

U.S. PATENT DOCUMENTS 5,103,310 A * 4/1992 Gibson et al. ............... 348/608
5,881,107 A * 3/1999 Termerinac et al. ......... 375/279
6,279,019 B1 * 8/2001 Oh et al. ..................... 708/300
6,834,292 B2 * 12/2004 Jiang et al. .................. 708/313
7,161,979 B2 * 1/2007 Wildhagen .................. 375/229

FOREIGN PATENT DOCUMENTS

DE 44 02 632 A1 8/1995

OTHER PUBLICATIONS

International Search Report dated Apr. 16, 2004 in connection with PCT Patent Application No. PCT/IB03/05647.
Truong Q. Nguyen, et al., "Structures for M-Channel Perfect-Reconstruction FIR QMF Banks Which Yield Linear-Phase Analysis Filters", IEEE Transactions on Acoustics, Speech, and Signal Processing, vol. 38, No. 3, Mar. 1990, p. 433-446.
P. P. Vaidyanathan, "Multirate Digital Filters, Filter Banks, Polyphase Networks, and Applications: A Tutorial", Proceedings of the IEEE, vol. 78, No. 1, Jan. 1990, p. 56-93.

* cited by examiner

Primary Examiner—David H Malzahn

(57) ABSTRACT

A multirate filter according to the invention comprises, a) an input unit (10) for receiving an input signal (Sin) and for providing a plurality of intermediate signals (IS1, IS2) in response to said input signal, b) a filter unit (20) coupled to the input unit (10), and c) an output unit (30) coupled to the filter unit (20), for generating an output signal (Sout). The filter unit (20) comprises at least a first and a second filter module (21, 22), with a transfer function $H_0(z)$ and a transfer function $H_1(z)$ respectively, which are mutually related according to the relations $H_0(z)=c_0(H_B(z)+M_{\alpha,\psi}H_B(z))$ and, $H_1(z)=c_1(H_B(z)+M_{\alpha,\psi}H_B(z))$ wherein, $M_{\alpha,\psi}(H_B(z))=\alpha z^{-2\psi}H_B^*(z^{-1})$, and wherein Formula (I), being the z-transform of $h_b[m]$. The multirate filter comprises a combination unit (11) coupled to said filter modules (21, 22) for generating a first combination signal (Ssum) and a second combination signal (Sdiff).

8 Claims, 7 Drawing Sheets

Figure 1:
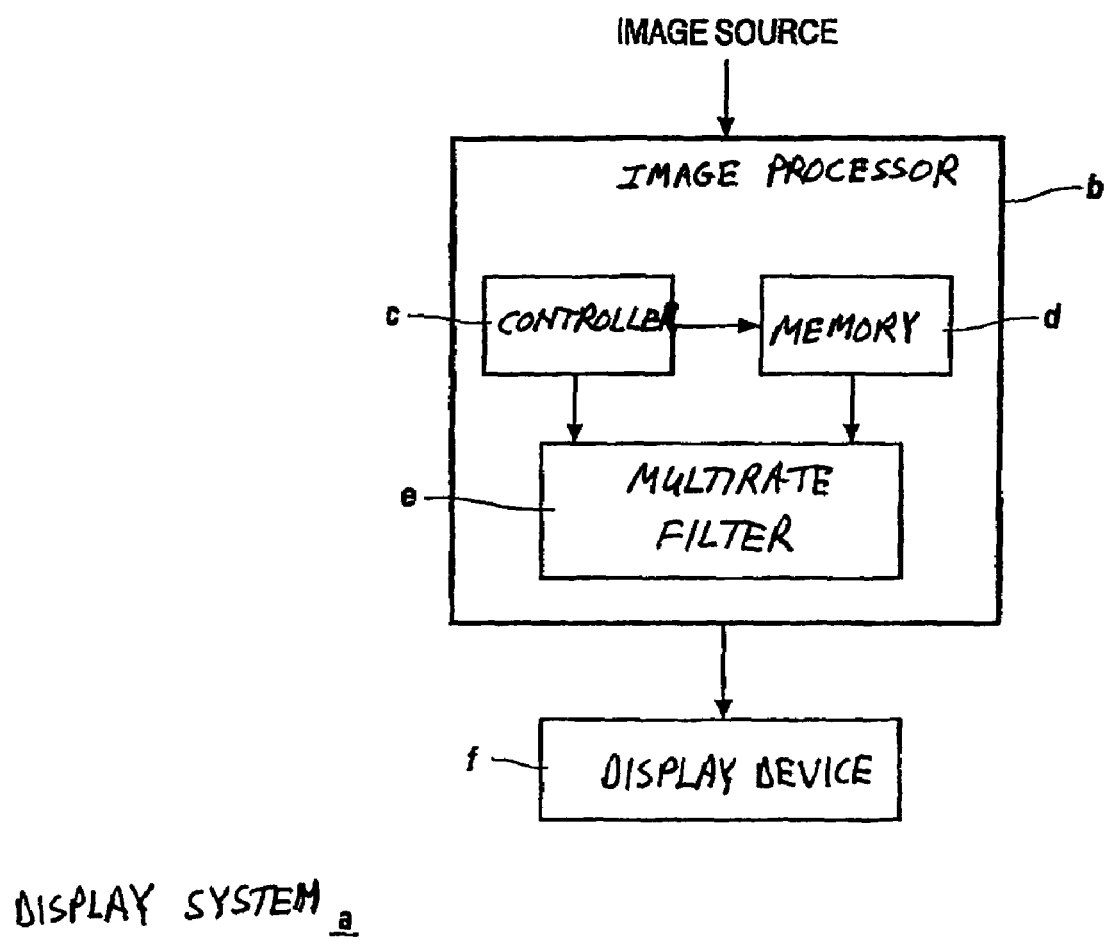

MULTIRATE FILTER AS WELL AS DISPLAY SYSTEM AND MOBILE TELEPHONE COMPRISING SAID MULTIRATE FILTER

The invention relates to a multirate filter as well as a display system and a mobile phone comprising a multirate filter.

Digital filters find widespread use in audio and video processing, for example in mobile phones, set top boxes, digital television sets, and other consumer, or professional products. Symmetric filters form an important class, because of their linear phase property and the possibility to exploit this symmetry to simplify the architecture of the filter and therewith reduce costs.

In particular, multirate filters are used in applications where the output signal and the input signal of the filter should have mutually different sample rates. Such filters are applied for example in image processing to effect a scaling of a digitally encoded image. One of the most important concepts in multirate filtering is the polyphase decomposition and the closely related polyphase structure. This concept allows for very efficient implementations both in hardware and software of interpolating and decimating filters.

A straightforward application of the polyphase decomposition however usually introduces asymmetric polyphase components, which substantially reduces the efficiency of the implementation It is a purpose of the invention to provide an architecture for a multirate filter wherein the symmetry of its components is recovered. For that purpose the multirate filter according to the invention has a construction as described herein. It has been recognized by the inventors that a symmetric multirate may be constructed from an input unit, a filter unit and an output unit, wherein the filter unit has symmetric modules derived from the polyphase components of the multirate filter provided that the modules are provided in pairs having transfer functions $H_0(z)$ and $H_1(z)$, which are derived from a basic transfer function $H_B(z)$ as follows. The first one $H_0(z)$ of the transfer functions is based on the sum of the basic transfer function $H_B(z)$ and its mirrored version:

$$H_0(z)=c_0(H_B(z)+M_{\alpha,\psi}H_B(z)), \text{ and}$$

the second one $H_1(z)$ is based on the difference of the basic transfer function $H_B(z)$ and its mirrored version:

$$H_1(z)=c_1(H_B(z)-M_{\alpha,\psi}H_B(z)).$$

The mirror operation $M_{\alpha,\psi}$ on the basic transfer function $H_B(z)$ is defined as:
$M_{\alpha,\psi}(H_B(z))=\alpha z^{-2\psi}H_B(z^{-1})$, and wherein
$H_B(z)=\Sigma\, h_b[m]z^{-m}$, $H_B(z)$ being the z-transform of $h_b[m]$
Therein the value $2\psi$ is an integer number, selected from Z, and
the value $\alpha$ is an element from the set C of complex numbers.

More in particular it has been discovered by the inventors that the asymmetric components of the polyphase filter can be redesigned into different embodiments or a combination thereof.

In one embodiment, the basic transfer function $H_B(z)$ is a polyphase component of the multirate filter. In another embodiment, the input unit comprises a combination unit and in another embodiment, the output unit comprises such a combination unit. In yet another embodiment, the basic transfer function $H_B(z)$ is a linear function of two polyphase components is of the multirate filter.

The invention further relates to a method of designing a multirate filter according to the invention. Such a method could either be part of a design tool, but could alternatively be part of a device having an adaptive filter. In that case the method enables that device to replace the polyphase components which it has calculated by and equivalent set of symmetrical modules.

Figure 2:
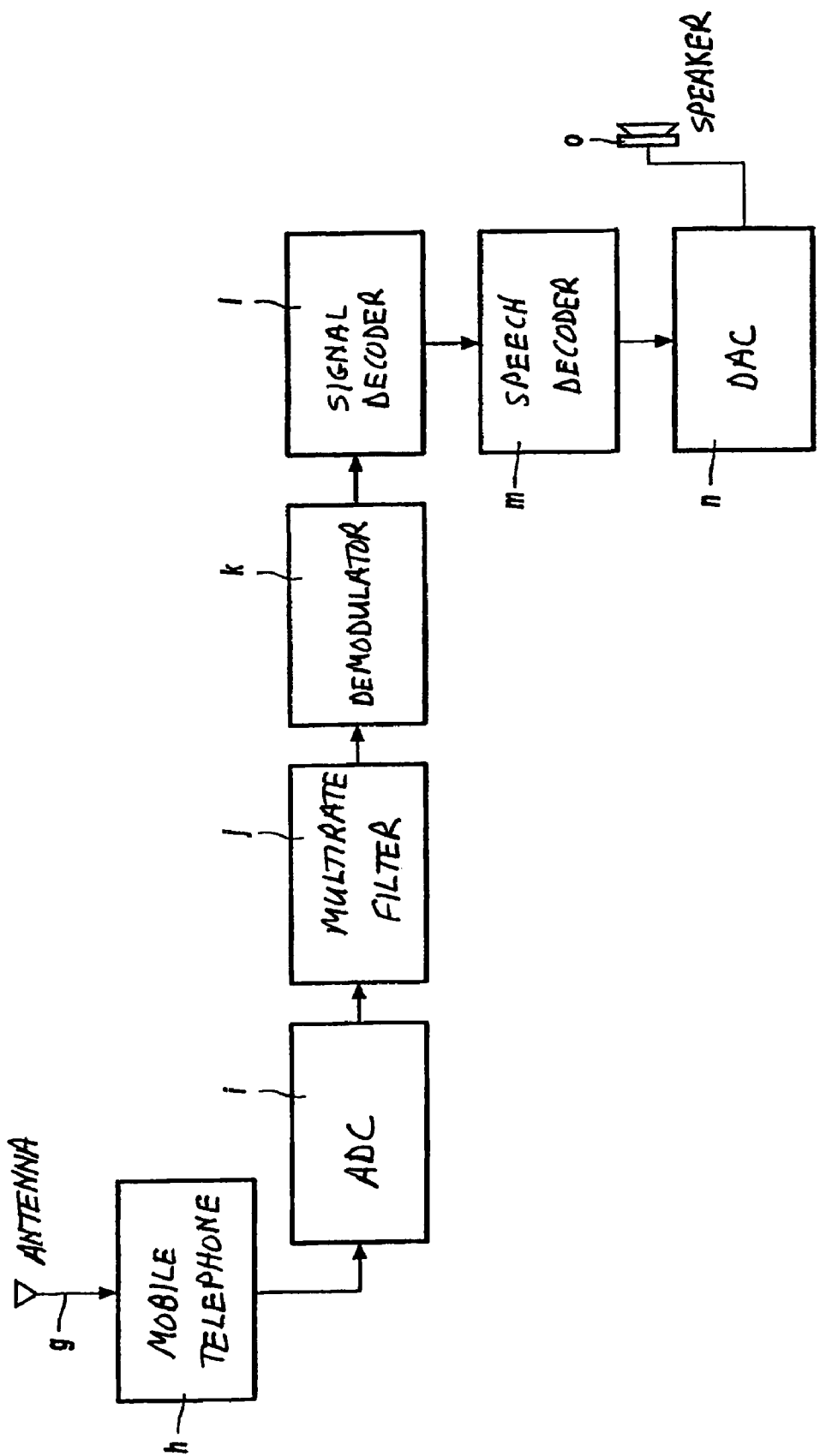
Figure 3A:
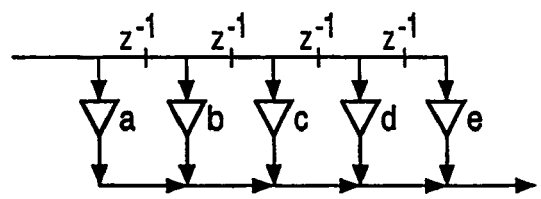
Figure 3B:
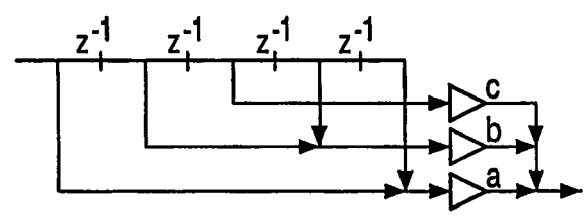
Figure 3C:
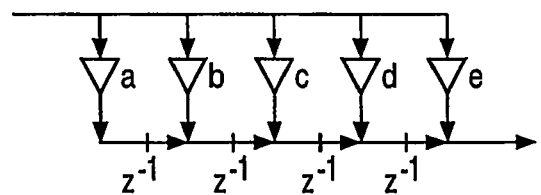
Figure 3D:
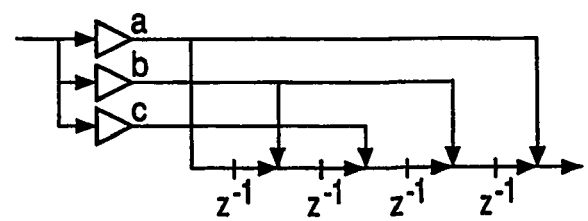
Figure 4A:
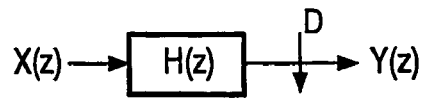
Figure 4B:
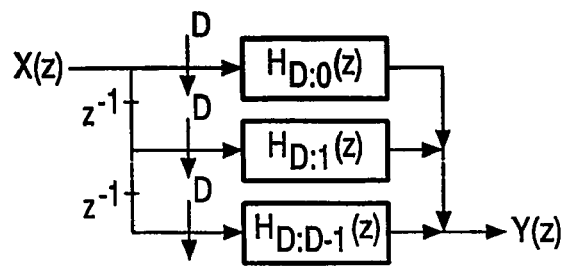
Figure 5A:
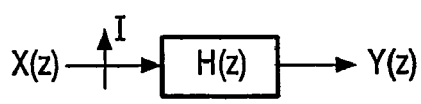
Figure 5B:
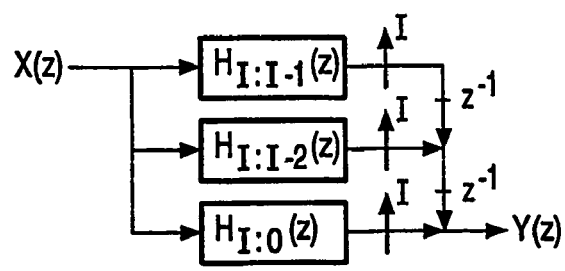
Figure 6A:
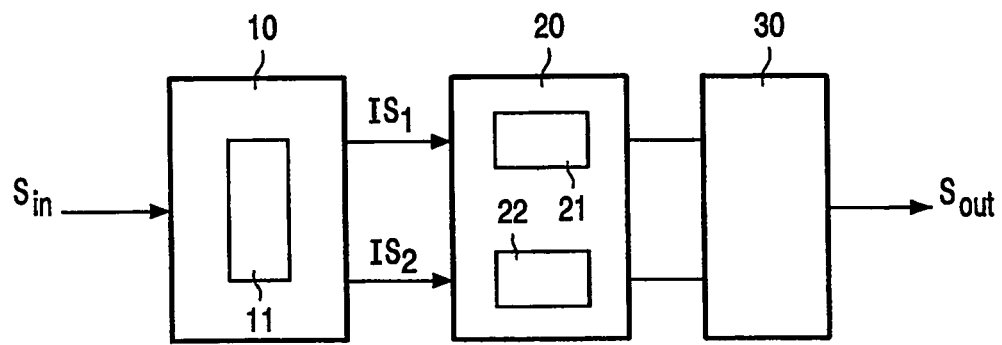
Figure 6B:
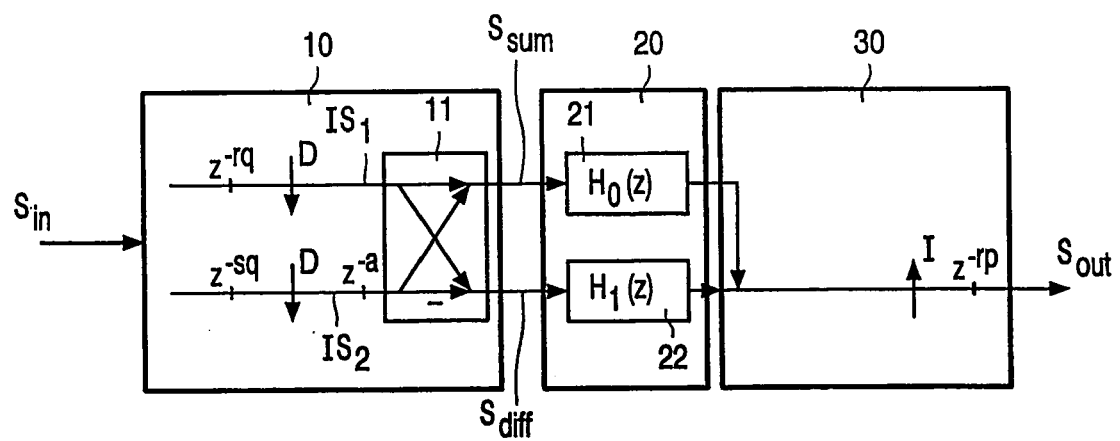
Figure 6C:
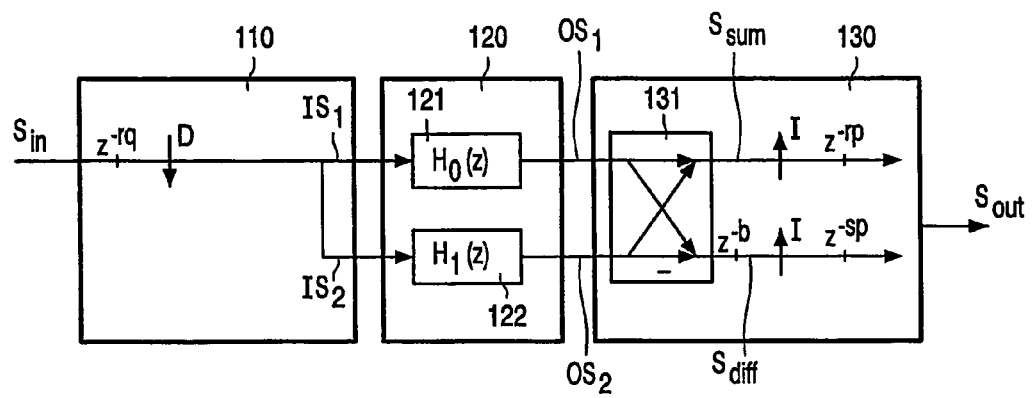
Figure 6D:
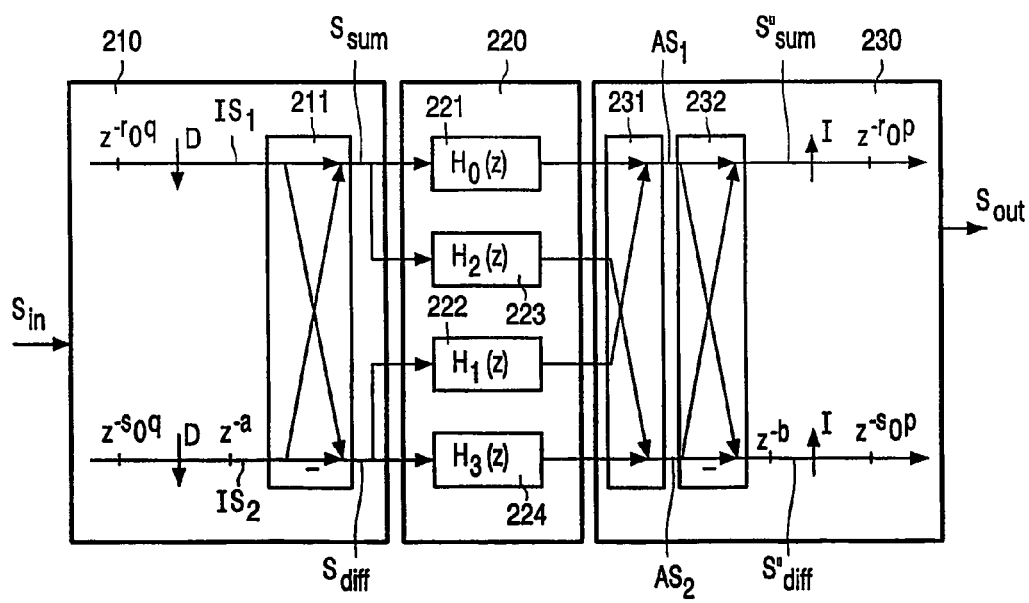
Figure 7A:
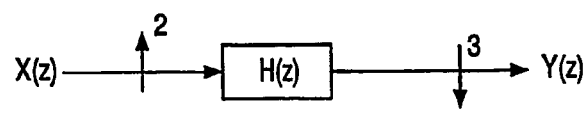
Figure 7B:
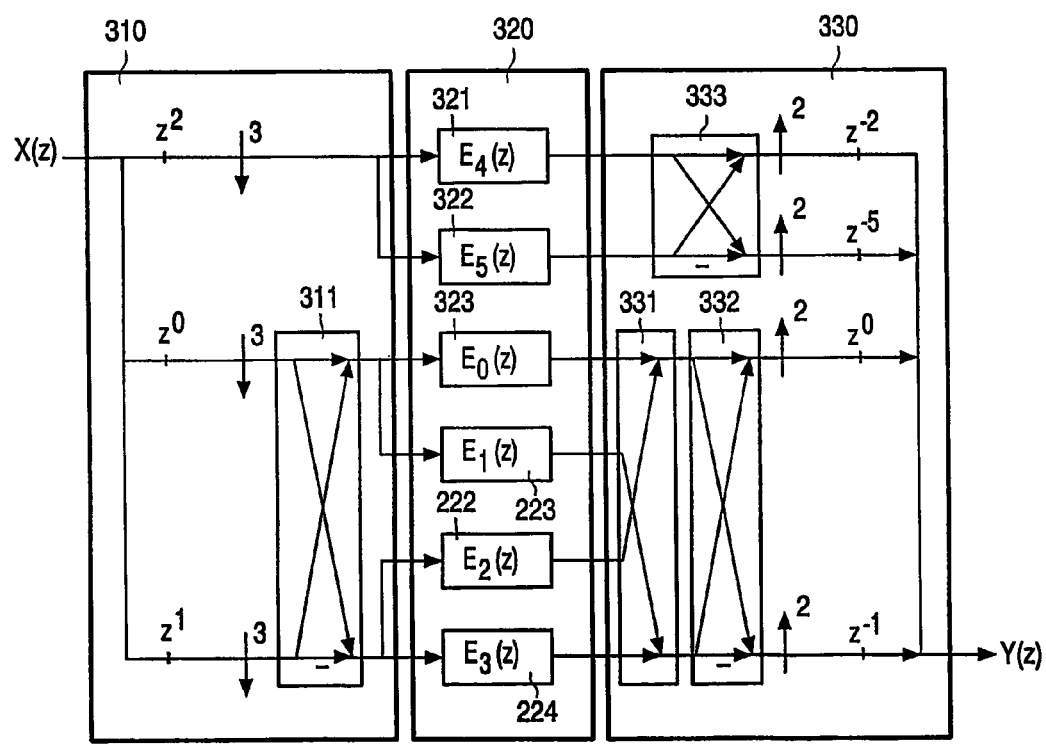

These and other aspects of the invention are described in more detail with reference to the drawings. Therein:

FIG. 1 illustrates a display system comprising a multirate filter according to the invention, FIG. 2 illustrates a mobile phone comprising a multirate filter according to the invention, FIG. 3A illustrates a filter in the form of a tapped delay line, FIG. 3B illustrates a simplified version of the filter of FIG. 3A, FIG. 3C illustrates a filter in the form of an adding delay line, FIG. 3D illustrates a simplified version of the filter of FIG. 3C, FIG. 4A shows a decimating filter, FIG. 4B shows implementation of the filter of FIG. 4A in the form of a polyphase structure, FIG. 5A shows an interpolating filter, FIG. 5B shows implementation of the filter of FIG. 5A in the form of a polyphase structure, FIG. 6A schematically shows a multirate filter according to the invention, FIG. 6B shows a first embodiment of the multirate filter according to the invention, FIG. 6C shows a second embodiment of the multirate filter according to the invention, FIG. 6D shows a third embodiment of the multirate filter according to the invention, FIG. 7A shows a filter having a rational decimation factor, FIG. 7B shows an implementation of this filter according to the invention.

FIG. 1 illustrates an example display system a having an image processor b that includes a multirate filter e. The filter e is implemented as a polyphase filter and allows both interpolation and decimation. Typically, the display system a includes filters for effecting both horizontal and vertical scaling. The controller c determines the appropriate scaling in each dimension, sets an appropriate mode of the filter e (interpolate or decimate, discrete phase or continuous phase, as required), and determines the appropriate coefficients that are provided by the memory d, depending upon the scaling and the mode.

FIG. 2 shows another application of a multirate filter according to the invention, in this case as filter for eliminating noise and other interference from a received signal in a mobile telephone h. A signal carrying, for example, encoded speech is received by antenna g, downconverted to a baseband and amplified, if necessary, by receiver h then routed through an analog-to-digital converter (ADC) i for conversion to discrete samples. The discrete samples are routed through the multirate filter j which filters out frequencies below a selected threshold. The threshold is selected to distinguish between information components of the transmitted signal and noise and other interference components. The signals are then demodulated by a demodulator k and decoded by a signal decoder l. Output signals from the signal decoder l are routed to a speech decoder m for conversion to digitized voice signals. The digitized voice signals are converted to analog signals by a digital to analog converter (DAC) n for ultimate output through a speaker o of the mobile telephone. Other components, such as error detection and correction components, may be provided as well within the receive portion of the mobile telephone.

Likewise the multirate filter according to the invention is applicable in the sending part of a mobile telephone. The architecture of the sending part (not shown) of a mobile telephone is globally the inverse of the receiving part. Hence, such a mobile telephone comprises an analog to digital converter for converting an analog speech signal into a digital speech signal. A speech encoder subsequently compresses the digital speech signal and provides the compressed signal. A signal encoder performs a channel encoding operation at the compressed signal and provides a channel signal. A modulator modulates the channel signal. The channel signal is filtered by a multirate filter according to the invention as described in more detail below. The filtered signal is then converted into an analog signal by a digital to analog converter. A transmitter transmits the analog signal.

In the present description a filter h[n] having z-transform H(z) is defined as $(\alpha, \psi)$-symmetric if it fulfills the following relationship:

$$H(z) = \alpha z^{-2\psi} H^*(z^{-1}), \quad (5)$$

which corresponds to
h[n]=αh*[2ψ−n] in the time domain

A special case is $(\alpha=1, \psi)$, h[n] being a real-valued function. For these filters h[n] the following relation holds:
h[2ψ−i]=h[i] wherein i is an integer, Examples are h[ ]=<a,b,c,b,a> having symmetry $(\alpha=1, \psi=2)$, and
h[ ]=<a,b,c,c,b,a> having symmetry $(\alpha=1, \psi=5/2)$ Another special case is $(\alpha=-1, \psi)$. For these filters either h[2ψ−i]=−h[i] wherein i is an integer, These filters are also referred to as anti-symmetric filters, not to be confused with asymmetric filters.

Examples are:
h[ ]=<a,b,0,−b,−a> having symmetry $(\alpha=-1, \psi=2)$, and
h[ ]=<a,b,0,0,−b,−a> having symmetry $(\alpha=-1, \psi=5/2)$ The sign of symmetry is however not limited to real values, as is illustrated by the following examples:
The filter h[ ]=<a+jb,b+ja> having symmetry $(\alpha=j, \psi=1/2)$, and
h[ ]=<a+jb,−b−ja> having symmetry $(\alpha=j, \psi=1/2)$.

Filters having $(\alpha, \psi)$-symmetry as defined above can be implemented efficiently. It is known to exploit their symmetry by reducing the number of components. This illustrated in FIGS. 3A-3D. FIG. 3A shows a symmetric filter implemented in the form of a tapped delay line. In the example shown, the delay line comprises 4 delay elements $z^{-1}$, a first multiplier having multiplication factor a is coupled to the input of the delay line, a second, a third and a fourth multiplier for multiplying with multiplication factors b,c,d are coupled to subsequent connection nodes between the delay elements $z^{-1}$, and a fifth multiplier having multiplication factor e is coupled to the output of the delay line. The sum of the output signals of the five multipliers is the output signal of the filter. The filter of FIG. 3A can be reduced to the filter of FIG. 3B having only three multipliers if the multiplication coefficients a and e are equal on the one hand and the multiplication coefficients b and d are equal on the other hand.

Analogously FIG. 3D shows an efficient implementation of the adding delay line of FIG. 3C.

Another known technique in filter design is the decomposition into polyphase components. This is in particular relevant for decimating or interpolating filters, or filters using a combination of decimation and interpolation.

Any filter H(z) can be decomposed in R polyphase components $H_{R:r}(z)$, which are related to H(z) as:

$$H(z) = \sum_{r=0}^{R-1} z^{-r} H_{R:r}(z^R),$$

wherein the polyphase components relate to the transfer function h( ) as:

$$H_{R:r}(z) = \sum_n h[Rn+r] z^{-n}$$

Such a polyphase decomposition of the filter has the advantage that the polyphase filter components can operate at a lower clock speed than a filter which is not decomposed.

This is illustrated in FIGS. 4A and 4B. FIG. 4A shows a decimating filter H(z) with decimation factor D. The filter has to operate at the same clock speed as the signal X(z) processed by the filter. FIG. 4B shows the decomposition of this filter into polyphase components $H_{D:0}(z)$, $H_{D:1}(z)$ . . . , $H_{D:D-1}(z)$. The polyphase components are coupled via a decimator to a delay line having delay elements with delay $z^{-1}$. The decimators decimate the sampling frequency of the signals obtained from the delay line with a factor D, so that the polyphase components may operate now at a corresponding lower frequency.

FIGS. 5A and 5B illustrate a second example. In this case the output signal Y(z) is obtained from the input signal X(z) by an interpolating filter H(z) with interpolation factor I. In FIG. 5A, the interpolated signal received by the filter H(z) has a frequency which is I times higher than the frequency X(z). FIG. 5B shows the filter of FIG. 5A decomposed into its polyphase components $H_{I:I-1}(z)$, $H_{I:I-2}(z)$ . . . , $H_{I:0}(z)$. The polyphase components each receive the input signal X(z), and may therefore operate at the same frequency as the signal X(z) instead of a frequency I times higher.

Unfortunately, even a symmetric filter may have asymmetric polyphase components, as is illustrated by the following example:

Consider the filter h[n] having symmetric impulse response <a,b,c,d,d,c,b,a>. In case of multirate factor R=2, both its polyphase components $h_{2:0}[n]$ and $h_{2:1}[n]$ are non-symmetric:
$h_{2:0}[n]$=<a,c,d,b>, and
$h_{2:1}[n]$=<b,d,c,a>.

It has been found by the inventors that the polyphase components of the multirate filter can be combined in $(\alpha, \psi)$ symmetric filter modules. The general structure of such a multirate filter according to the invention is illustrated in FIG. 6A.

The multirate filter according to the invention shown therein has:
an input unit 10 for receiving an input signal Sin and for providing a plurality of intermediate signals IS1, IS2 in response to said input signal,
a filter unit 20 coupled to the input unit 10,
an output unit 30 coupled to the filter unit 20, for generating an output signal Sout.

The filter unit 20 comprises at least a first and a second filter module 21, 22, having a transfer function $H_0(z)$ and a transfer function $H_1(z)$ respectively, which are mutually related according to the relations $$H_0(z) = c_0(H_B(z) + M_{\alpha,\psi} H_B(z)) \text{ and}$$

$$H_1(z) = c_1(H_B(z) - M_{\alpha,\psi} H_B(z)).$$

Therein $M_{\alpha,\psi}H_B(z)=\alpha z^{-2\psi}H_B^{\mathcal{F}}(z^{-1})$, and $H_B^{\mathcal{F}}(z)=\Sigma h_b^*[m]z^{-m}$.

$H_B(z)$ is the z-transform of $h_b[m]$.

By combining a non-symmetric filter $H_B(z)$ with its mirrored version $M_{\alpha,\psi}H_B(z)$, either a symmetric filter (in case of combining by addition) or an anti-symmetric filter (in case of combining by subtraction) is obtained. This is illustrated by the following example. When adding the two non-symmetric polyphase components $h_{2:0}[n]$=<a,c,d,b>, and $h_{2:1}[n]$=<b,d,c,a>, the following symmetric transfer function is obtained:

h[n]=<a+b,c+d,d+c,b+a>

Subtracting these polyphase components from each other gives the following anti-symmetric transfer function.

h'[n]=<a−b,c−d,d−c,b−a>

The multirate filter comprises a combination unit 11 coupled to the filter modules 21, 22 for generating a first combination signal Ssum and a second combination signal Sdiff. The combination unit 11 may be a part of the input unit 10, or a part of the output unit 30. Alternatively both the input unit 10 and the output unit 30 may comprise one or more combination units.

In an embodiment of the invention the basic transfer function $H_B(z)$ is a polyphase component i.e.

$$H_B(z) = H_{R:r}(z) = \sum_n h[Rn+r]z^{-n}$$

FIG. 6B shows a first subembodiment of said embodiment. Therein the combination unit 11 is comprised in the input unit 10. The input unit 10 generates a first and a second intermediate signal IS1, IS2 from the input signal Sin. The first and the second intermediate signal IS1, IS2 are delayed by delay functions $z^{-rq}$ and $z^{-sq}$ respectively, wherein rq and sq are integer numbers selected from Z. After the delay the signals are decimated with a factor D, so that the intermediate signals have a sampling rate which is D lower than that of the input signal Sin. The combination unit 11 subsequently generates the first and the second combination signal Ssum, Sdiff from the pair of intermediate signals IS1, IS2. In the embodiment shown in FIG. 6B the first combination signal Ssum is the sum of the intermediate signals IS1 and IS2 and the second combination signal Sdiff is the difference of the intermediate signals IS1 and IS2. The first filter module 21 filters the first combination signal Ssum and the second filter module 22 filters the second combination signal Sdiff. The output unit 30 subsequently combines the output signals of the filter modules 21 and 22 to generate the overall output signal Sout. The output unit 30 may additionally perform an interpolation with a factor I and introduce an extra delay $z^{-rp}$ to the output signal Sout.

As is clear from the above, the transfer functions of the filter modules 21 and 22 are symmetric. The transfer function $H_0(z)$ of the first filter module is the sum of the basic transfer function $H_B(z)$ and its mirrored counterpart, and the transfer function $H_1(z)$ of the second filter module is the difference of the basic transfer function $H_B(z)$ and its mirrored counterpart. Hence, both transfer functions $H_0(z)$ and $H_1(z)$ allow an efficient implementation, having a relatively small number of multipliers. On the one hand the filter modules can operate relatively slowly as they process the signal Ssum and Sdiff, which are derived from the decimated signals IS1 and IS2. The optional interpolation stage only takes place after the filter unit 20.

FIG. 6C shows a second subembodiment wherein the transfer function $H_B(z)$ is a polyphase component. In this case the first and the second filter module 121, 122 each filter a respective one of the intermediate signals IS1, IS2. The combination unit 131 is comprised in the output unit 130 and generates the first combination signal Ssum and the second combination signal Sdiff from output signals OS1, OS2 of the first and the second filter module. Optionally the combination signals are interpolated by interpolation factor I and delayed by a delay $z^{-rp}$ and $z^{-sp}$ respectively before they are recombined into the output signal. Likewise in this case the filter modules 121 and 122 are symmetric, and can be implemented with relatively small number of multiplier. Because the filter is operative after decimation and before interpolation, the filter can operate at a relatively low clock speed.

The transfer functions $H_0(z)$ and $H_1(z)$ of the first and the second filter module are the sum of a basic transfer function $H_B(z)$ and its mirrored version $M_{\alpha,\psi}H_B(z)$. In the embodiments shown in FIGS. 6B and 6C the basic transfer function is a polyphase component of the transfer function of the multirate filter.

FIG. 6D shows an embodiment wherein the basic transfer function $H_B(z)$ from which the transfer functions $H_0(z)$ and $H_1(z)$ are composed is derived from two polyphase components according to the relation:

$$H_B(z)=H_{R:r_0}(z)+z^b H_{R:r_1}(z).$$

The combination unit 211 is comprised in the input unit 210, and generates the first and the second combination signal Ssum, Sdiff from a pair of the said intermediate signals IS1, IS2. The first filter module 221 filters the first combination signal Ssum and the second filter module 222 filters the second combination signal Sdiff. The filter unit 220 further comprises a third filter module 223 with a transfer function $H_2(z)$ and a fourth filter module 224 with a transfer function $H_3(z)$ which are mutually related according to the relations $$H_2(z)=c_2(H'_B(z)-MH'_B(z))$$

$$H_3(z)=c_3(H'_B(z)+MH'_B(z)).$$

Also the further basic transfer function $H_B'(z)$ is derived from a combination of two polyphase components:

$$H'_B(z)=H_{R:r_0}(z)-z^b H_{R:r_1}(z)$$

The third 223 and fourth filter module 224 each filter a respective one of the first combination signal Ssum and the second combination signal Sdiff. The filter comprises a first further combination unit 231 for generating a first auxiliary signal AS1 representing the sum of the output signals of the first filter module 221 and the second filter module 222, and a second auxiliary signal AS2 representing the sum of the output signals of the third filter module 222 and the fourth filter module 223. The filter further comprises a second further combination unit 232 for generating a further sum signal Ssum" and a further difference signal Sdiff" from the first and the second auxiliary signal AS1, AS2. These signals are recombined into an output signal Sout after an optional interpolation with a factor I. The signals Ssum" and Sdiff" may further be delayed with an additional delay $z^{-rqp}$ and $z^{-0p}$.

As in the embodiments shown in FIGS. 6B and 6C the filter unit 220 of the multirate filter can on the one hand operate at a relatively low speed, as compared to a filter without polyphase decomposition. And on the other hand the modules 221, 222, 223, 224 of the filter unit 220 have a symmetric transfer function, so that they can be implemented with a relatively small number of multipliers.

FIGS. 7A and 7B illustrate a further embodiment of the invention. FIG. 7A shows a multirate filter having a rational decimation factor 3/2.

FIG. 7B shows the inventive implementation of this filter. The filter unit 320 comprises two groups of filter modules. One group comprises the modules 232, 324, 325 and 326, having transfer functions $E_0(z)$, $E_1(z)$, $E_2(z)$ and $E_3(z)$ respectively. The other group comprises the modules 321 and 322 having transfer functions $E_4(z)$ and $E_5(z)$ respectively. The transfer functions for the first group are derived from the polyphase components of the original filter H(z) as follows.

$$E_0(z) = \frac{1}{4}(H_{6:0}(z) + H_{6:-2}(z) + H_{6:3}(z) + H_{6:1}(z))$$

$$E_1(z) = \frac{1}{4}(H_{6:0}(z) + H_{6:-2}(z) - H_{6:3}(z) - H_{6:1}(z))$$

$$E_2(z) = \frac{1}{4}(H_{6:0}(z) - H_{6:-2}(z) + H_{6:3}(z) - H_{6:1}(z))$$

$$E_3(z) = \frac{1}{4}(H_{6:0}(z) - H_{6:-2}(z) - H_{6:3}(z) + H_{6:1}(z)).$$

The transfer functions for the second group are $$E_4(z) = \frac{1}{2}(H_{6:2}(z) + H_{6:5}(z))$$

$$E_5(z) = \frac{1}{2}(H_{6:2}(z) - H_{6:5}(z)).$$

It is noted that the skilled person will consider many alternatives within the scope of the invention as defined by the claims. For example the delay functions $z^2$, $z^0$ and $z^1$ in the input unit may be replaced by delay functions $z^{2-k}$, $z^{-k}$ and $z^{1-k}$ in combination with a delay function $z^k$ in the signal line providing the input signal X(z). It is noted that merely the relative delays generated between the signals provided by the delay functions in the input unit 310 is of importance.

It is also clear to the skilled person that several functions may be interchanged. For example, the decimate units indicated by the downpointing arrows with label 3 may be located at the outputs of the combination unit 311. Furthermore the delay units indicated with $z^0$ and $z^1$ may be included in the combination unit 311. In that case a first combination element of the combination unit 311 (the upper one in the drawing) generates the signal $X(z)+z^1 X(z)=X(z)(1+z)$. The other combination element of said combination unit generates $X(z)(1-z)$.

The skilled person will further realized that other operations can be interchanged for example the sequence of operations:

interpolating with a factor L
delaying with $z^a$,
decimating with a factor D may be replaced by the sequence delaying with $z^{aq}$,
decimating with a factor D
interpolating with a factor I,
delaying with $z^{ap}$.

Provided that D and I are coprime.

Other examples are that multiplication operations can be interchanged with delay operations and with decimation or interpolation operations.

A multirate filter according to the invention can be designed by carrying out the following steps:
a. decomposing a symmetrical filter H into its polyphase components $H_{R:1}, \ldots, H_{R:R-1}$.

This kind of decomposition is well known, and is described for example in the thesis "Efficiency in multirate and complex digital signal processing" by A. W. M. van den Enden, ISBN 90 6674 650 5. In particular reference is made to chapter 2.8 and to Appendix C thereof.

The so obtained set of polyphase components may be replaced by a set of symmetrical modules as follows. Naturally those polyphase components which are already symmetrical need not be replaced. The following situations may occur.

b. The set of polyphase components may comprise pairs of components $H_{R:r1}$ and $H_{R:r2}$ which are asymmetrical, which share a common input, and which are related to each other according to the relation $H_{R:r2}=M_{\alpha,\psi}(H_{R:r1})$. The parameters $\alpha,\psi$ can be different for each pair. Such pairs of components $H_{R:r1}$ and $H_{R:r2}$ can be replaced by a first module with transfer function $H_0=H_{R:r1}+H_{R:r2}$,
a second module with transfer function $H_1=H_{R:r1}-H_{R:r2}$,
wherein the first and the second module sharing the common input, and by
a combination unit for generating a first and a second combination signal from the output signals of the first and the second module.

c. The set of polyphase components may comprise pairs of components $H_{R:r1}$ and $H_{R:r2}$ which are asymmetrical, which share a common output, and which are related to each other according to the relation $H_{R:r2}=M_{\alpha,\psi}(H_{R:r1})$, wherein the parameters $\alpha,\psi$ can be different for each pair.

Each such a pair of components $H_{R:r1}$ and $H_{R:r2}$ can be replaced by a first module with transfer function $H_0=H_{R:r1}+H_{R:r2}$,
a second module with transfer function $H_1=H_{R:r1}-R_{R:r2}$,
which modules share the common output, and by
a combination unit for generating a first combination signal from a first and a
second intermediate signal, and providing said combination signal to the third module, and for generating a second combination signal from a first and a second intermediate signal, and providing said combination signal to the fourth module.

d. Finally components may occur in quadruplets which are asymmetrical and which comprise a first pair $H_{R:r1}$, $H_{R:r2}$ which are related by $H_{R:r2}=M_{\alpha,\psi}(H_{R:r1})$
a second pair $H_{R:r3}$, $H_{R:r4}$ which are related by $H_{R:r4}=M_{\alpha,\psi}(H_{R:r3})$ wherein,
the components $H_{R:r1}$ and $H_{R:r3}$ share a first common input,
the components $H_{R:r2}$ and $H_{R:r4}$ share a second common input,
the components $H_{R:r1}$ and $H_{R:r2}$ share a first common output, and
the components $H_{R:r3}$ and $H_{R:r4}$ share a second common output.

Each such a quadruplet can be replaced by a quadruplet of symmetrical filter modules and three combination units. The quadruplet of filter modules comprises a first module having transfer function $H_0=H_{R:r0}+H_{R:r1}+H_{R:r2}+H_{R:r3}$, a second module having transfer function $H_1=H_{R:r0}-H_{R:r1}-H_{R:r2}+H_{R:r3}$, a third module having transfer function $H_2=H_{R:r0}+H_{R:r1}-H_{R:r2}-H_{R:r3}$, a fourth module having transfer function $H_3=H_{R:r0}-H_{R:r1}+H_{R:r2}-H_{R:r3}$.

A first combination unit generates a first combination signal from input signals received at the first and the second common input, and provides said first combination signal to the first and the second module. It also generates a second combination signal from those input signals, and provides that to the third and the fourth module.

A second combination unit generates a first auxiliary signal from output signals generated by the first and the third unit. It generates a second auxiliary signal from output signals generated by the second and the fourth unit.

A third combination unit generates a first and a second output signal from the first and the second auxiliary signal.

It is noted that the situations b, c and d may occur in combinations.

The invention claimed is:

1. A multirate filter comprising:
an input unit for receiving an input signal and for providing a plurality of intermediate signals in response to said input signal,
a filter unit coupled to the input unit,
an output unit coupled to the filter unit, for generating an output signal,
the filter unit comprising at least a first and a second filter module, having a transfer function $H_0(z)$ and a transfer function $H_1(z)$ respectively, which are mutually related according to the relations $H_0(z)=c_0(H_B(z)+M_{\alpha,\psi}H_B(z))$ and $H_1(z)=c_1(H_B(z)+M_{\alpha,\psi}H_B(z))$, wherein $M_{\alpha,\psi}(H_B(z))=\alpha z^{-2\psi}H_B^*(z^{-1})$, and wherein $H_B^*(z)=\Sigma h_b^*[m]z^{-m}$, $H_B(z)$ being the z-transform of $h_b[m]$, $H_B(z)=H_{R_r}(z)=\Sigma h[Rn+R]z^{-n}$, wherein $H(z)$ is the z-transform of $h[n]$ and wherein $\alpha$ is an element from the set C of complex numbers and $2\psi$ is an integer number selected from z, the multirate filter comprising a combination unit coupled to said filter modules for generating a first combination signal and a second combination signal.

2. The multirate filter according to claim 1, wherein the combination unit is comprised in the input unit, and generates the first and the second combination signal from a pair of the said intermediate signals and that the first filter module filters the first combination signal and the second filter module filters the second combination signal.

3. The multirate filter according to claim 1, wherein the first and the second filter module each filter a respective one of the said intermediate signals and that the combination unit is comprised in the output unit and generates the first combination signal and the second combination signal from output signals of the first and the second filter module.

4. The multirate filter according to claim 1, wherein $H_B(z)=H_{R:r0}(z)+z^b H_{R:r1}(z)$ and wherein the combination unit is comprised in the input unit, and generates the first and the second combination signal from a pair of the said intermediate signals and that the first filter module filters the first combination signal and the second filter module filters the second combination signal, wherein the filter unit comprises a third filter module with a transfer function $H_2(z)$ and a fourth filter module with a transfer function $H_3(z)$ which are mutually related according to the relations $H_2(z)=c_2(H'_B(z)-M_{\alpha,\psi}H'_B(z))$ $H_3(z)=c_3(H'_B(z)+M_{\alpha,\psi}H'_B(z))$, wherein $H'_B(z)=H_{R:r0}(z)-z^b H_{R:r1}(z)$ which third and fourth filter module each filter a respective one of the first combination signal and the second combination signal, the filter comprising a first further combination unit for generating a first auxiliary signal and a second auxiliary signal in response to the output signals of the third filter module and the fourth filter module, the filter comprising a second further combination unit for generating a first and a second further combination signal from the first and the second auxiliary signal.

5. An image processing device comprising an input for receiving image data, a multirate filter according to claim 1, a controller for controlling the filter, a memory for storing data to be used by the configurable filter, and an output for providing output data to a display device.

6. A mobile telephone comprising:
a receiver for receiving an information signal from an antenna,
an analog-to-digital converter for converting the information signal to discrete samples,
a multirate filter according to claim 1, for filtering the converted information signal from a received signal,
a demodulator for demodulating an output signal of the filter,
a signal decoder for performing a channel decoding operation at an output signal obtained from the demodulator, and
a speech decoder for decompressing a speech signal obtained from the signal decoder and providing an output signal to a digital to analog converter which generates an analog output signal.

7. A mobile telephone comprising:
an analog to digital converter for converting an analog speech signal into a digital speech signal,
a speech encoder for compressing the digital speech signal and providing the compressed signal,
a signal encoder for performing a channel encoding operation at the compressed signal and providing a channel signal,
a modulator for modulating the channel signal,
a multirate filter according to claim 1, for filtering the channel signal,
a digital to analog converter, for converting the filtered channel signal into an analog signal, and
a transmitter to transmit the analog signal.

8. A method for designing a multirate filter as claimed in claim 1, the method comprising:
a. decomposing a symmetrical filter H into its polyphase components $H_{R:1}, \ldots, H_{R:R-1}$, and performing at least one of the following:

b.1. identifying pairs of components $H_{R:r1}$ and $H_{R:r2}$ which are asymmetrical, which share a common input, and which are related to each other according to the relation $H_{Rr:2}=M_{\alpha,\psi}(H_{R:r1})$, wherein the parameters $\alpha,\psi$ can be different for each pair, and b.2. replacing each such pair of components $H_{R:r1}$ and $H_{R:r2}$ by a first module with transfer function $H_0=H_{R:r1}+H_{R:r2}$, a second module with transfer function $H_1=H_{R:r1}+H_{R:r2}$, the first and the second module sharing the common input, and by a combination unit for generating a first and a second combination signal from the output signals of the first and the second module; and c.1. identifying pairs of components $H_{R:r1}$ and $H_{R:r2}$ which are asymmetrical, which share a common output, and which are related to each other according to the relation $H_{R:r2}=M_{\alpha,\psi}(H_{R:r1})$, wherein the parameters $\alpha,\psi$ can be different for each pair, and can be different from those identified in step b1, c.2. replacing each such pair of components $H_{R:r1}$ and $H_{R:r2}$ by a first module with transfer function $H_0=H_{R:r1}+H_{R:r2}$, a second module with transfer function $H_1=H_{R:r1}+H_{R:r2}$, which modules share the common output, and by a combination unit for generating a first combination signal from a first and a second intermediate signal, and providing said combination signal to a third module, and for generating a second combination signal from a first and a second intermediate signal, and providing said combination signal to a fourth module; and d.1. identifying quadruplets of components which are asymmetrical and which comprise a first pair $H_{R:r1}$, $H_{R:r2}$ which are related by $H_{R:r2}=M_{\alpha,\psi}(H_{R:r1})$ a second pair $H_{R:r3}$, $H_{R:r4}$ which are related by $H_{R:r4}=M_{\alpha,\psi}(H_{R:r3})$ wherein, the components $H_{R:r1}$ and $H_{R:r3}$ share a first common input, the components $H_{R:r2}$ and $H_{R:r4}$ share a second common input, the components $H_{R:r1}$ and $H_{R:r2}$ share a first common output, and the components $H_{R:r3}$ and $H_{R:r4}$ share a second common output, d.2 and replacing said quadruplet by a first module having transfer function $H_0=H_{R:r0}+H_{R:r1}+H_{R:r2}+H_{R:r3}$, a second module having transfer function $H_0=H_{R:r0}-H_{R:r1}-H_{R:r2}+H_{R:r3}$, a third module having transfer function $H_0=H_{R:r0}+H_{R:r1}-H_{R:r2}-H_{R:r3}$, a fourth module having transfer function $H_0=H_{R:r0}-H_{R:r1}+H_{R:r2}-H_{R:r3}$, a first combination unit for generating a first combination signal generated from input signals received at the first and the second common input, and providing said first combination signal to the first and the second module, and for generating a second combination signal generated from those input signals, and providing said second combination signal to the third and the fourth module, a second combination unit for generating a first auxiliary signal from output signals generated by the first and the third unit, and for generating a second auxiliary signal from output signals generated by the second and the fourth unit, a third combination unit for generating a first and a second output signal from the first and the second auxiliary signal.

* * * * *